United States Patent
Lee et al.

(10) Patent No.: US 11,011,085 B2
(45) Date of Patent: May 18, 2021

(54) DISPLAY DEVICE WITH CRACK-SENSING LINE

(71) Applicant: SAMSUNG DISPLAY CO., LTD., Yongin-si (KR)

(72) Inventors: Seung-Kyu Lee, Asan-si (KR); Seung Ji Cha, Seoul (KR); Tae Hoon Kwon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 95 days.

(21) Appl. No.: 15/652,026

(22) Filed: Jul. 17, 2017

(65) Prior Publication Data

US 2018/0033355 A1 Feb. 1, 2018

(30) Foreign Application Priority Data

Jul. 26, 2016 (KR) .................. 10-2016-0094800

(51) Int. Cl.
*G09G 3/00* (2006.01)
*H01L 27/32* (2006.01)
*G09G 3/20* (2006.01)
*G09G 3/3225* (2016.01)
(Continued)

(52) U.S. Cl.
CPC ............. *G09G 3/006* (2013.01); *G09G 3/20* (2013.01); *H01L 27/3223* (2013.01); *H01L 27/3276* (2013.01); *H01L 27/3279* (2013.01); *G09G 3/3225* (2013.01); *G09G 3/3648* (2013.01); *G09G 2300/0413* (2013.01); *G09G 2300/0426* (2013.01); *G09G 2300/0452* (2013.01); *G09G 2330/04* (2013.01); *G09G 2330/12* (2013.01);
(Continued)

(58) Field of Classification Search
CPC ........................................................ G06F 3/006
See application file for complete search history.

(56) References Cited

U.S. PATENT DOCUMENTS

| | | | | |
|---|---|---|---|---|
| 7,995,011 B2 * | 8/2011 | Jeong | ..................... | G09G 3/006 315/169.3 |
| 8,531,617 B2 * | 9/2013 | Kim | ..................... | G02F 1/1345 349/152 |
| 9,082,665 B2 * | 7/2015 | Du | ..................... | G02F 1/13452 |

(Continued)

FOREIGN PATENT DOCUMENTS

| | | |
|---|---|---|
| EP | 3098869 A1 | 11/2016 |
| KR | 1011134760000 | 1/2012 |

(Continued)

OTHER PUBLICATIONS

European Search Report for Application No. 17183301.5 dated Nov. 2, 2017.

(Continued)

*Primary Examiner* — Patrick F Marinelli
(74) *Attorney, Agent, or Firm* — F. Chau & Associates, LLC

(57) ABSTRACT

A display device includes a substrate having a display area and a non-display area. A plurality of pixels is disposed in the display area of the substrate. A plurality of data lines is connected to the plurality of pixels. A crack sensing line is connected to at least one of the plurality of data lines. The crack sensing line is disposed in the non-display area of the substrate. A dummy pattern layer is connected to the crack sensing line.

20 Claims, 18 Drawing Sheets

(51) Int. Cl.
*G09G 3/36* (2006.01)
*H01L 27/12* (2006.01)

(52) U.S. Cl.
CPC .. *H01L 27/1244* (2013.01); *H01L 2251/5392* (2013.01)

(56) References Cited

U.S. PATENT DOCUMENTS

| | | | | |
|---|---|---|---|---|
| 9,191,663 B2* | 11/2015 | Kwak | | H04N 17/004 |
| 9,262,952 B2* | 2/2016 | Kim | | G09G 3/3233 |
| 9,495,903 B2* | 11/2016 | Kwon | | G09G 3/3225 |
| 9,576,512 B2* | 2/2017 | Park | | G09G 3/006 |
| 9,581,841 B2* | 2/2017 | Yanagisawa | | G02F 1/1309 |
| 9,614,183 B2* | 4/2017 | Zhang | | H05B 33/0896 |
| 9,767,727 B2* | 9/2017 | Byun | | G09G 3/3208 |
| 9,928,768 B2* | 3/2018 | Kim | | G09G 3/2092 |
| 9,990,873 B2* | 6/2018 | Jang | | G09G 3/3225 |
| 10,026,793 B2* | 7/2018 | Jeon | | H01L 27/3258 |
| 10,210,782 B2* | 2/2019 | Lee | | G09G 3/006 |
| 10,217,398 B2* | 2/2019 | Yeh | | G09G 3/2092 |
| 10,321,562 B2* | 6/2019 | Lim | | H05K 1/144 |
| 10,643,511 B2* | 5/2020 | Zhang | | G01M 5/0083 |
| 2004/0262638 A1* | 12/2004 | Mazoyer | | H01L 27/10852 257/201 |
| 2005/0162360 A1* | 7/2005 | Ishihara | | G09G 3/2011 345/89 |
| 2008/0001865 A1 | 1/2008 | Yanagisawa et al. | | |
| 2008/0054798 A1* | 3/2008 | Jeong | | G09G 3/006 313/504 |
| 2008/0106661 A1* | 5/2008 | Kim | | G02F 1/1345 349/40 |
| 2008/0111135 A1* | 5/2008 | Choi | | H01L 27/1255 257/71 |
| 2009/0066872 A1* | 3/2009 | Hirato | | G02F 1/133707 349/46 |
| 2009/0121985 A1* | 5/2009 | Kang | | G09G 3/3233 345/82 |
| 2009/0201053 A1* | 8/2009 | Chang | | G02F 1/134363 327/108 |
| 2011/0141074 A1* | 6/2011 | Koo | | G09G 3/3648 345/205 |
| 2013/0056736 A1* | 3/2013 | Kim | | G09G 3/3677 257/59 |
| 2014/0002700 A1* | 1/2014 | Oishi | | H04N 5/369 348/273 |
| 2014/0145739 A1* | 5/2014 | Park | | G09G 3/006 324/750.3 |
| 2014/0176844 A1* | 6/2014 | Yanagisawa | | G02F 1/1309 349/43 |
| 2014/0240521 A1* | 8/2014 | Kwak | | H04N 17/004 348/189 |
| 2014/0241487 A1 | 8/2014 | Yamazaki et al. | | |
| 2014/0291846 A1* | 10/2014 | Chai | | G02F 1/1345 257/749 |
| 2014/0332898 A1* | 11/2014 | Du | | H01L 27/124 257/386 |
| 2014/0354285 A1* | 12/2014 | Kim | | G09G 3/3233 324/414 |
| 2014/0368228 A1* | 12/2014 | Kim | | G02F 1/1309 324/750.3 |
| 2015/0108482 A1* | 4/2015 | Kim | | H01L 27/3276 257/71 |
| 2015/0185574 A1* | 7/2015 | Han | | G02F 1/136286 349/43 |
| 2015/0241501 A1* | 8/2015 | Jang | | G09G 3/3225 324/527 |
| 2015/0255017 A1* | 9/2015 | Kim | | G09G 3/3258 315/172 |
| 2015/0338951 A1* | 11/2015 | Lee | | G06F 3/044 345/174 |
| 2015/0342053 A1* | 11/2015 | Savic | | H01L 23/3107 361/761 |
| 2015/0379923 A1* | 12/2015 | Lee | | G09G 3/3233 345/206 |
| 2016/0043010 A1* | 2/2016 | Kwak | | H01L 22/14 257/48 |
| 2016/0140896 A1* | 5/2016 | Kwon | | G09G 3/3225 345/76 |
| 2016/0141228 A1* | 5/2016 | Leobandung | | H01L 24/06 257/621 |
| 2016/0189581 A1* | 6/2016 | Hwang | | G09G 3/006 345/691 |
| 2016/0232826 A1* | 8/2016 | Cho | | G09G 3/006 |
| 2016/0293078 A1* | 10/2016 | Byun | | G09G 3/006 |
| 2016/0293884 A1* | 10/2016 | Zhang | | H05B 33/0896 |
| 2016/0307971 A1* | 10/2016 | Jeon | | H01L 27/3258 |
| 2016/0351093 A1* | 12/2016 | Kim | | G09G 3/2092 |
| 2017/0090635 A1* | 3/2017 | Kim | | G06F 3/0412 |
| 2017/0235866 A1* | 8/2017 | Ueberreiter | | G06F 30/398 716/55 |
| 2017/0270842 A1* | 9/2017 | Nam | | H01L 22/32 |
| 2017/0294166 A1* | 10/2017 | Kim | | G09G 3/3266 |
| 2017/0330929 A1* | 11/2017 | Park | | G09G 3/3225 |
| 2017/0345773 A1* | 11/2017 | Baek | | H01L 22/34 |
| 2018/0027651 A1* | 1/2018 | Lim | | H01L 24/16 361/749 |
| 2018/0033354 A1* | 2/2018 | Lee | | G09G 3/006 |
| 2018/0033355 A1* | 2/2018 | Lee | | G09G 3/20 |
| 2018/0053466 A1* | 2/2018 | Zhang | | H01L 27/3276 |
| 2018/0090517 A1* | 3/2018 | Park | | H01L 27/1248 |
| 2018/0174505 A1* | 6/2018 | Mandlik | | G09G 3/3677 |
| 2018/0174539 A1* | 6/2018 | Suzuki | | G06F 3/044 |
| 2018/0218658 A1* | 8/2018 | Kim | | G09G 3/2092 |
| 2018/0293930 A1* | 10/2018 | Yeh | | G09G 3/20 |
| 2018/0350284 A1* | 12/2018 | Park | | G09G 3/20 |
| 2019/0180663 A1* | 6/2019 | Lee | | G09G 3/006 |
| 2019/0213935 A1* | 7/2019 | Jung | | H01L 27/3223 |
| 2019/0239345 A1* | 8/2019 | Lim | | H01L 21/481 |
| 2020/0066196 A1* | 2/2020 | Hao | | G09G 3/3275 |
| 2020/0090564 A1* | 3/2020 | Huang | | G01R 27/14 |
| 2020/0090566 A1* | 3/2020 | Lee | | G01R 27/08 |
| 2020/0111395 A1* | 4/2020 | Kang | | G09G 3/006 |

FOREIGN PATENT DOCUMENTS

| | | |
|---|---|---|
| KR | 1013009140000 | 8/2013 |
| KR | 1020130136806 | 12/2013 |
| KR | 1020160117784 | 11/2016 |

OTHER PUBLICATIONS

Extended European Search Report dated Feb. 9, 2018 for Application No. 17183301.5.

* cited by examiner

DISPLAY DEVICE WITH CRACK-SENSING LINE

CROSS-REFERENCE TO RELATED APPLICATION

This application claims priority to and the benefit of Korean Patent Application No. 10-2016-0094800, filed in the Korean Intellectual Property Office on Jul. 26, 2016, the entire contents of which are incorporated by reference herein.

TECHNICAL FIELD

The present disclosure relates to a display device, and more specifically, to a display device having a crack-sensing line disposed thereon.

DISCUSSION OF THE RELATED ART

Flat panel displays such as liquid crystal display (LCD) devices and organic light emitting diode (OLED) display devices tend to be light weight and small and are therefore well suited for portable electronic devices such as mobile phones, smart phones, wearable devices, satellite guidance systems, digital cameras, e-book readers, portable game consoles, and the like.

Flat panel displays such as LCDs and OLEDs may be manufactured to include a flexible/bendable substrate and then the displays may be bent into a desired shape and position within the portable electronic devices.

During the manufacturing process, a crack may be generated in the substrate of the display device as the flat panel display is bent. While large cracks may be more easily spotted, smaller cracks may be difficult to detect and might not adversely affect the performance of the display device, at least not at first. However, the crack may become larger with the passage of time, and moisture may penetrate inside the display device through the crack. Eventually these display devices may fail.

To detect even small cracks along the display device substrate, a crack sensing line may be disposed. However, while manufacturing the display device, the substrate may be moved along rollers, and static electricity may result. The crack sensing line may be connected to a thin film transistor disposed in a display area, and static electricity on the crack sensing line may damage the thin film transistor connected thereto. As the crack sensing line may be disposed closely to other wires, static electricity on the crack sensing line may cause a short circuit between the crack sensing line and the adjacent wires.

SUMMARY

A display device includes a substrate having a display area and a non-display area. A plurality of pixels is disposed in the display area of the substrate. A plurality of data lines is connected to the plurality of pixels. A crack sensing line is connected to at least one of the plurality of data lines. The crack sensing line is disposed in the non-display area of the substrate. A dummy pattern layer is connected to the crack sensing line.

A display device includes a flexible substrate. A plurality of pixels is disposed on the flexible substrate. A plurality of data lines is disposed on the substrate and is connected to the plurality of pixels. A first crack sensing line is connected to the plurality of data lines. A dummy pattern layer is disposed between the first crack sensing line and the flexible substrate.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
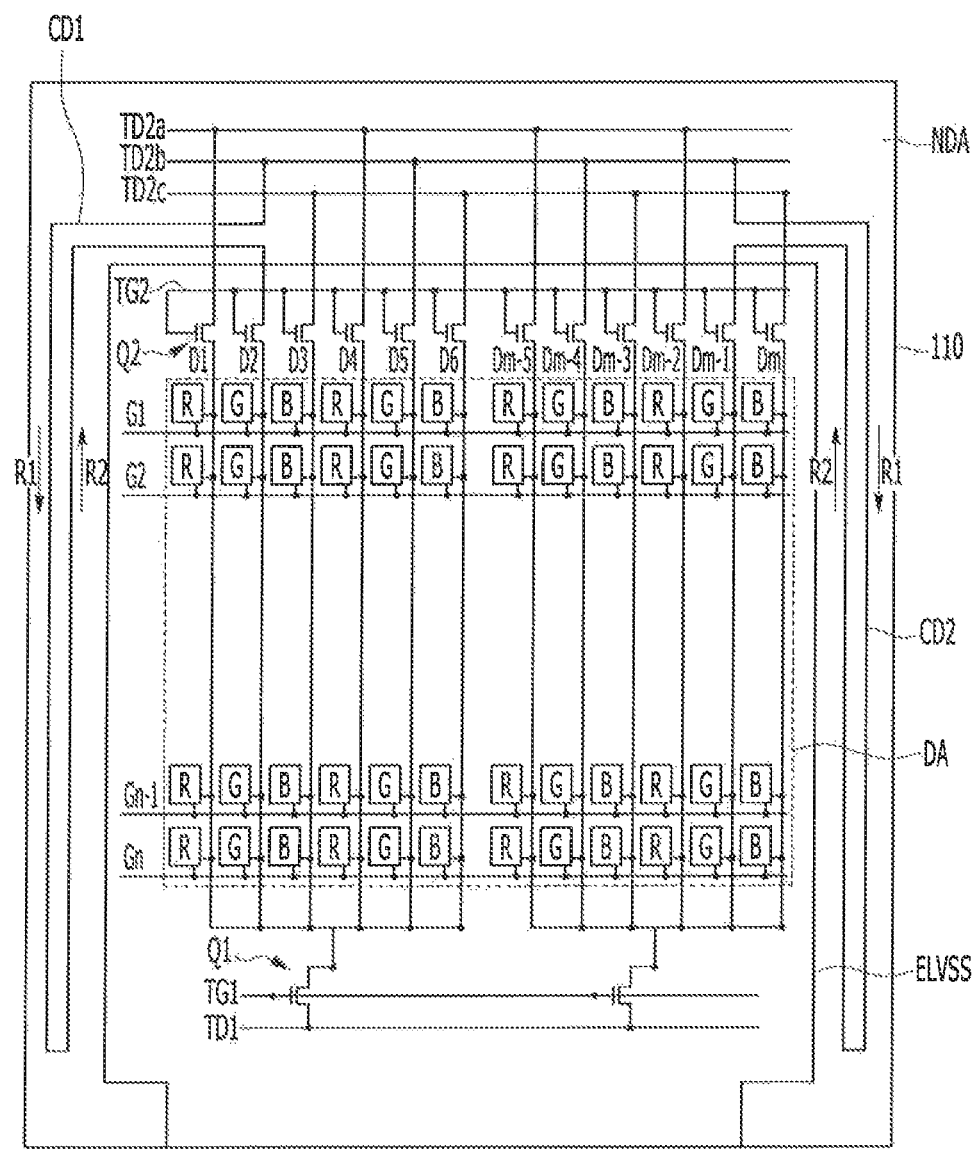
FIG. 1 is a top plan view illustrating a display device according to an exemplary embodiment of the present inventive concept.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Like reference numerals may designate like elements throughout the specification.

In the drawings, the thickness of layers, films, panels, regions, areas, etc., may be exaggerated for clarity.

It will be understood that when an element such as a layer, film, region, area, or substrate is referred to as being "on" another element, it can be directly on the other element or intervening elements may also be present.

A display device according to an exemplary embodiment will be described below with reference to FIG. 1.

FIG. 1 is a top plan view illustrating a display device according to an exemplary embodiment of the present inventive concept.

As shown in FIG. 1, the display device according to an exemplary embodiment includes a substrate 110.

The substrate 110 may be made of an insulating material such as glass, polymer, stainless steel, etc. The substrate 110 may be flexible, stretchable, foldable, bendable, or rollable. As the substrate 110 may be flexible, stretchable, foldable, bendable, or rollable, the display device may be entirely flexible, stretchable, foldable, bendable, or rollable. For example, the substrate 110 may be a flexible film type including a resin such as polyimide.

The substrate 110 includes a display area DA displaying an image and a non-display area NDA in which an image is not displayed. A driver transmitting signals to drive the display area DA may be disposed within the non-display area NDA. The non-display area NDA is disposed at an edge of the display area DA. FIG. 1 shows the non-display area NDA enclosing the display area DA, however the present invention is not limited thereto. The non-display area NDA may be disposed at both edges of the display area DA, and the non-display area NDA may be disposed at a left edge and a lower edge of the display area DA.

A plurality of pixels R, G, and B and a plurality of gate lines G1, G2, ..., G(n-1), and Gn and a plurality of data lines D1, D2, D3, D4, D5, D6, ..., D(m-5), D((m-4)), D((m-3)), D((m-2)), D(m-1), and Dm that are connected to the plurality of pixels R, G, and B are disposed on the display area DA of the substrate 110.

The pixels R, G, and B are the smallest units for displaying the image, and each pixel R, G, B, may be capable of displaying only a single color. The plurality of pixels R, G, and B are disposed in a matrix shape along a row direction and a column direction.

The plurality of gate lines G1, G2, ..., G(n-1), Gn may be disposed with a predetermined interval from each other, and each of the gate lines G1, G2, ... G(n-1), and Gn extends substantially along the row direction. Those pixels of the plurality of pixels R, G, and B that are adjacent in the column direction are connected to the same gate lines G1, G2, ..., G(n-1), and Gn.

The gate lines G1, G2, ..., G(n-1), and Gn are connected to a gate driver and receive a gate signal including a gate-on voltage and a gate-off voltage from the gate driver. The gate driver may be disposed on the non-display area NDA of the substrate 110.

The plurality of data lines D1, D2, D3, D4, D5, D6, ..., D(m-5), D(m-4), D(m-3), D(m-2), D(m-1), and Dm may be disposed with a predetermined interval from each other, and each of the data lines D1, D2, D3, D4, D5, D6 ..., D(m-5), D(m-4), D(m-3), D(m-2), D(m-1), and Dm extend approximately along the column direction. Those pixels of the plurality of pixels R, G, and B that are adjacent in the column direction are connected to the same data lines D1, D2, D3, D4, D5, D6, ..., D(m-5), D(m-4), D(m-3), D(m-2), D(m-1), and Dm.

The data lines D1, D2, D3, D4, D5, D6, ..., D(m-5), D(m-4), D(m-3), D(m-2), D(m-1), and Dm are connected to a data driver and receive a data signal from the data driver. The data driver may be disposed on the non-display area NDA of the substrate 110. The data lines D1, D2, D3, D4, D5, D6, ..., D(m-5), D(m-4), D(m-3), D(m-2), D(m-1), and Dm transmit the data signal to the pixels R, G, and B, respectively, thereby the pixels R, G, and B may respectively represent a predetermined luminance.

Each of the pixels R, G, and B are connected to each of the gate lines G1, G2, ..., G(n-1), and Gn and each of the data lines D1, D2, D3, D4, D5, D6, ..., D(m-5), D(m-4), D(m-3), D(m-2), D(m-1), and Dm by the thin film transistor. When the gate-on voltage is applied to the gate lines G1, G2, ..., G(n-1), and Gn, the thin film transistor is turned on such that the data signal is applied to each pixel through the data lines D1, D2, D3, D4, D5, D6, ..., D(m-5), D(m-4), D(m-3), D(m-2), D(m-1), and Dm.

A first test gate line TG1, a second test gate line TG2, a first test signal line TD1, and a plurality of second test signal lines TD2a, TD2b, and TD2c are disposed in the non-display area NDA of the substrate 110.

The first test gate line TG1 and the first test signal line TD1 may be disposed in parallel to each other along the row direction. FIG. 1 illustrates the first test gate line TG1 and the first test signal line TD1 disposed at a lower edge of the substrate 110, however the present invention is not limited thereto, and the positions of the first test gate line TG1 and the first test signal line TD1 may be variously changed.

The second test gate line TG2 and the second test signal lines TD2a, TD2b, and TD2c may be disposed in parallel along the row direction. FIG. 1 illustrates the second test gate line TG2 and the second test signal lines TD2a, TD2b, and TD2c disposed on the upper edge of the substrate 110, however the present invention is not limited thereto, and the positions of the second test gate line TG2 and the second test signal lines TD2a, TD2b, and TD2c may be variously changed.

A first switching element Q1 connected to the first test gate line TG1, the first test signal line TD1, and the data lines D1, D2, D3, D4, D5, D6 ..., D(m-5), D(m-4), D(m-3), D(m-2), D(m-1), and Dm is disposed in the non-display area NDA of the substrate 110. The plurality of first switching elements Q1 may be disposed on the substrate 110, and each first switching element Q1 may be connected to six among the plurality of data lines D1, D2, D3, D4, D5, D6 ..., D(m-5), D(m-4), D(m-3), D(m-2), D(m-1), and Dm.

In the non-display area NDA of the substrate 110, a second switching element Q2 is connected to the second test gate line TG2, the second test signal lines TD2a, TD2b, and TD2c, and the data lines D1, D2, D3, D4, D5, D6 ..., D(m-5), D(m-4), D(m-3), D(m-2), D(m-1), and Dm. Three second test signal lines TD2a, TD2b, and TD2c and the plurality of second switching elements Q2 may be disposed on the substrate 110. A number of the second switching elements Q2 may correspond to a number of the data lines D1, D2, D3, D4, D5, D6 ..., D(m-5), D(m-4), D(m-3), D(m-2), D(m-1), and Dm. Each second switching element Q2 is connected to one of the plurality of data lines D1, 132, 133, D4, D5, D6 ..., D(m-5), D(m-4), D(m-3), D(m-2), D(m-1), and Dm. The adjacent second switching elements Q2 may be connected to the different second test signal lines TD2a, TD2b, and TD2c.

The first crack sensing line CD1 and the second crack sensing line CD2 are disposed in the non-display area NDA of the substrate 110. The first crack sensing line CD1 and the second crack sensing line CD2 are disposed on both sides of the plurality of pixels R, G, and B. The first crack sensing line CD1 may be disposed at the left edge of the substrate 110 and the second crack sensing line CD2 may be disposed at the right edge of the substrate 110. The first crack sensing line CD1 and the second crack sensing line CD2 may be extended in parallel to each other.

The first crack sensing line CD1 and the second crack sensing line CD2 are disposed at the partial region of the upper edge of the substrate 110, however the present invention is not limited thereto, and the first crack sensing line CD1 and the second crack sensing line CD2 may be disposed to enclose most of the upper edge of the substrate 110 and may be disposed at the lower edge. The first crack sensing line CD1 and the second crack sensing line CD2 may be formed of the same layer as the metal layer disposed at the display area DA of the substrate 110.

A first end of the first crack sensing line CD1 is connected to one of the second test signal lines TD2a, TD2b, and TD2c. For example, the first end of the first crack sensing line CD1 may be connected to the second test signal line TD2b disposed at a second row from the upper part of the substrate 110. A second end of the first crack sensing line CD1 is connected to one of the data lines D1, D2, D3, D4, D5, D6 . . . , D(m-5), D(m-4), D(m-3), D(m-2), D(m-1), and Dm through the second switching element Q2. For example, the second end of the first crack sensing line CD1 may be connected to the data line D2 (hereinafter, referred to as 'a first data line') disposed at a second column from the left edge of the substrate 110.

The first crack sensing line CD1 starts from the first end connected to the second test signal line TD2b and extends in the first direction R1 along the upper edge and the left edge of the substrate 110, and then extends in a second direction that is opposite to the first direction R1 as a changed direction and is connected to the first data line D2 by the second end.

The first end of the second crack sensing line CD2 is connected to one of the second test signal lines TD2a, TD2b, and TD2c. For example, the first end of the second crack sensing line CD2 may be connected to the second test signal line TD2b disposed at the second row from the upper edge of the substrate 110. The second end of the second crack sensing line CD2 is connected to one of the data lines D1, D2, D3, D4, D5, D6 . . . , D(m-5), D(m-4), D(m-3), D(m-2), D(m-1), and Dm through the second switching element Q2. For example, the second end of the second crack sensing line CD2 may be connected to the data line D(m-1) (hereinafter, referred to as 'a second data line') disposed at the second column from the right edge of the second end.

The second crack sensing line CD2 starts from the first end connected to the second test signal line TD2b and extends in the first direction R1 along the upper edge and the right edge of the substrate 110, and then extends in the second direction R2, which is the opposite direction to the first direction R1, and is connected to the second data line D(m-1) by the second end.

The first crack sensing line CD1 and the second crack sensing line CD2 are disposed at the non-display area NDA adjacent to both edges of the display area DA, and respectively start from the first ends and extend in the first direction R1 and then again extend in the second direction R2 to reach the second end, thereby forming a hemi-ring shape.

A common voltage line ELVSS is disposed in the non-display area NDA of the substrate 110. The common voltage line ELVSS may be disposed to enclose at least part of the display area DA. For example, the common voltage line ELVSS may be disposed so as to enclose the left edge, the upper edge, and the right edge of the display area DA. The common voltage line ELVSS may be close to the first crack sensing line CD1 and the second crack sensing line CD2. The common voltage line ELVSS may include a part disposed between the first crack sensing line CD1 and the display area DA and a part disposed between the second crack sensing line CD2 and the display area DA. The common voltage line ELVSS may extend in parallel to the first crack sensing line CD1 and the second crack sensing line CD2. A common voltage is applied to the common voltage line ELVSS. The voltage applied to the common voltage line ELVSS may be different from a voltage applied to the first crack sensing line CD1 and the second crack sensing line CD2.

Figure 3:
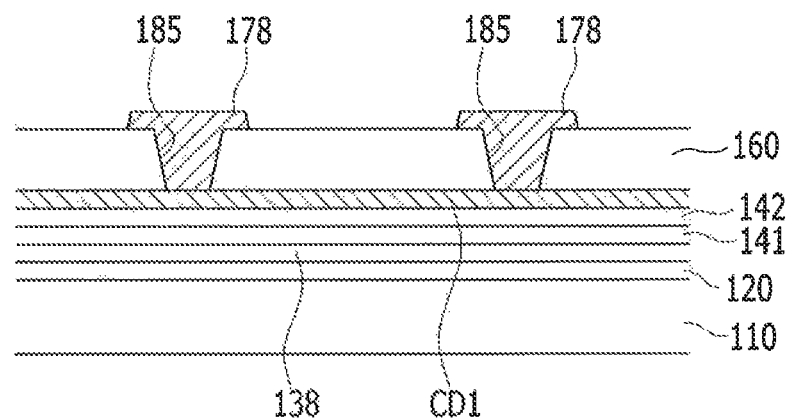
FIG. 3 is a cross-sectional view illustrating a non-display area shown in FIG. 2 taken along a line III-III.
Figure 4:
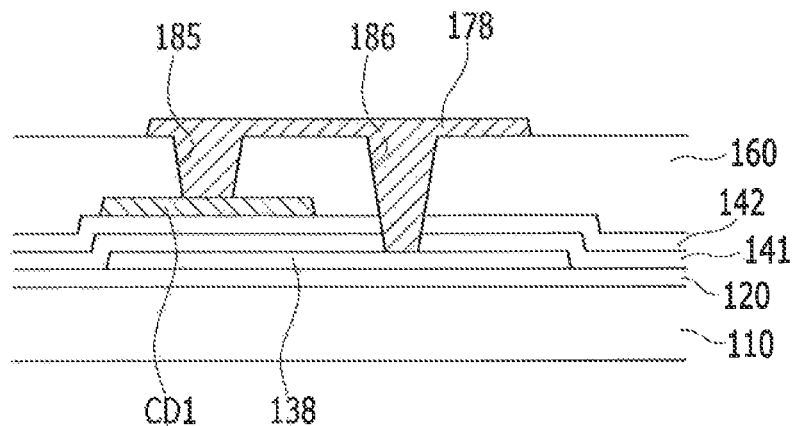
FIG. 4 is a cross-sectional view illustrating a non-display area shown in FIG. 2 taken along a line IV-IV.

Next, the non-display area of the display device, according to an exemplary embodiment of the present inventive concept, will be described with reference to FIG. 2 to FIG. 4.

Figure 2:
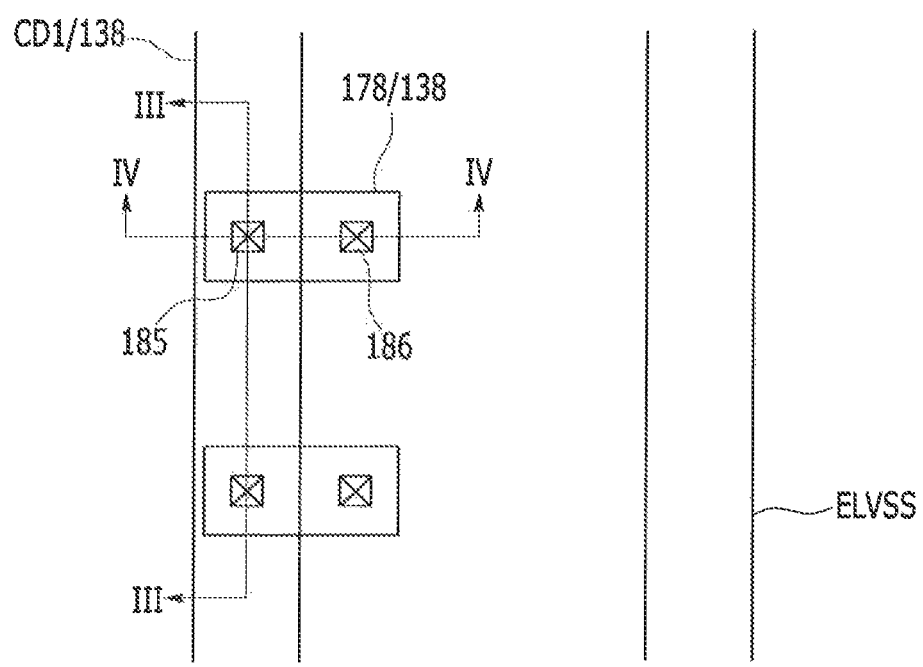
FIG. 2 is a top plan view illustrating a non-display area of a display device according to an exemplary embodiment of the present inventive concept.

FIG. 2 is a top plan view illustrating a non-display area of a display device according to an exemplary embodiment of the present inventive concept. FIG. 3 is a cross-sectional view of a non-display area shown in FIG. 2, taken along a line III-III. FIG. 4 is a cross-sectional view of a non-display area shown in FIG. 2, taken along a line IV-IV.

As shown in FIG. 2, a first crack sensing line CD1 and a dummy pattern layer 138 overlapping the first crack sensing line CD1 are disposed in the non-display area NDA of the substrate 110.

The dummy pattern layer 138 may be made of a semiconductor material. The dummy pattern layer 138 may be made of a material having higher resistance than that of the first crack sensing line CD1.

A buffer layer 120 may be disposed between the substrate 110 and the dummy pattern layer 138. The buffer layer 120 may include a silicon nitride (SiNx) or a silicon oxide (SiOx).

The first crack sensing line CD1 may be made of a metal material. The first crack sensing line CD1 overlaps the dummy pattern layer 138, and the first crack sensing line CD1 is disposed on the dummy pattern layer 138. The first crack sensing line CD1 and the dummy pattern layer 138 extend in the same direction and may have substantially the same width. The first crack sensing line CD1 and the dummy pattern layer 138 may have different widths in a partial region or an entire region.

A first gate insulating layer 141 and a second gate insulating layer 142 may be disposed between the dummy pattern layer 138 and the first crack sensing line CD1. The first gate insulating layer 141 and the second gate insulating layer 142 may be made of an inorganic insulating material such as a silicon nitride and/or a silicon oxide. Two insulating layers are deposited between the dummy pattern layer 138 and the first crack sensing line CD1, however the present exemplary embodiment is not limited thereto. An insulating layer made of a single layer or three or more insulating layers may be disposed between the dummy pattern layer 138 and the first crack sensing line CD1.

A connection electrode 178 overlapping the dummy pattern layer 138 and the first crack sensing line CD1 is disposed on the substrate 110. The connection electrode 178 may be disposed on the dummy pattern layer 138 and the first crack sensing line CD1. The connection electrode 178 may be made of a metal material.

An interlayer insulating layer 160 may be disposed between the first crack sensing line CD1 and the connection electrode 178. The first gate insulating layer 141, the second gate insulating layer 142, and the interlayer insulating layer 160 may each be disposed between the dummy pattern layer 138 and the connection electrode 178. The interlayer insulating layer 160 may be made of the organic insulating material or the inorganic insulating material.

The interlayer insulating layer 160 has a first contact hole 185 overlapping the first crack sensing line CD1. The first gate insulating layer 141, the second gate insulating layer 142, and the interlayer insulating layer 160 have a second contact hole 186 overlapping the dummy pattern layer 138. The second contact hole 186 does not overlap the first crack sensing line CD1. For example, the second contact hole 186 is disposed at a part where the dummy pattern layer 138 and the first crack sensing line CD1 do not overlap. The connection electrode 178 is connected to the first crack sensing line CD1 through the first contact hole 185 and to the dummy pattern layer 138 through the second contact hole 186. Accordingly, the first crack sensing line CD1 is connected to the dummy pattern layer 138 through the connection electrode 178.

In the process of manufacturing the display device, according to an exemplary embodiment of the present inventive concept, while moving the substrate 110, static electricity may be generated on the first crack sensing line CD1. The first crack sensing line CD1 is connected to the first data line D2, and the characteristics of the thin film transistor connected to the first data line D2 may be changed by the static electricity. For example, a threshold voltage of the thin film transistor may be changed. Moreover, there is a risk that movement of the charge may be generated by a potential difference between the first crack sensing line CD1 and the adjacent common voltage line ELVSS, or a risk that the first crack sensing line CD1 and the common voltage line ELVSS may be shorted.

According to an exemplary embodiment of the present inventive concept, the dummy pattern layer 138 is made of a material having a larger resistance than that of the first crack sensing line CD1, and the first crack sensing line CD1 and the dummy pattern layer 138 are connected to each other. Accordingly, even if the static electricity is generated on the first crack sensing line CD1, a peak current value may be decreased by an RC delay in the dummy pattern layer 138. Accordingly, the characteristics of the thin film transistor connected to the first crack sensing line CD1 may be maintained and short circuits between the first crack sensing CD1 and the adjacent wires may be prevented.

The second crack sensing line CD2 and the surrounding constituent elements may be substantially similar to the first crack sensing line CD1 and its surrounding constituent elements and so to the extent that the second crack sensing line CD2 and its surrounding constituents are not further described, it may be assumed that the description of the first crack sensing line CD1 and its surrounding constituents may apply. Like the first crack sensing line CD1, the second crack sensing line CD2 may also overlap the dummy pattern layer and the dummy pattern layer may have a higher resistance than the second crack sensing line CD2. In this case, the second crack sensing line CD2 is connected to the dummy pattern layer.

Next, the display area of the display device, according to an exemplary embodiment of the present inventive concept, will be described with reference to FIG. 5.

Figure 5:
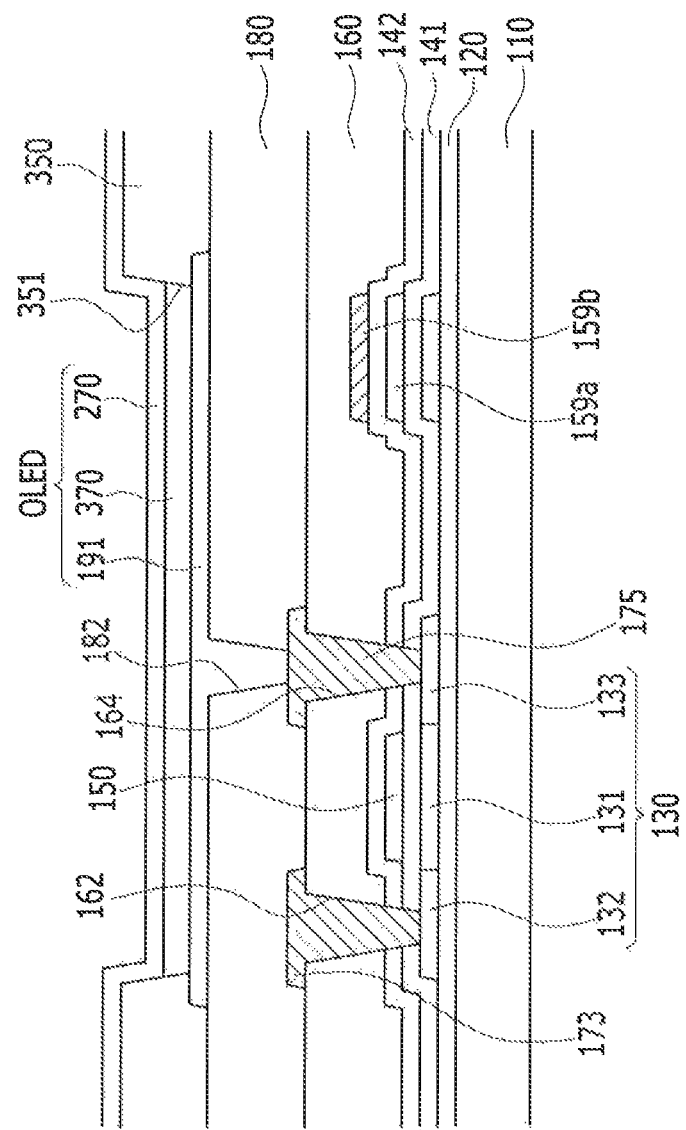
FIG. 5 is a cross-sectional view illustrating a display area of a display device according to an exemplary embodiment of the present inventive concept.

FIG. 5 is a cross-sectional view showing a display area of a display device according to an exemplary embodiment of the present inventive concept.

As shown in FIG. 5, the buffer layer 120 is disposed in the display area DA of the substrate 110 of the display device. The buffer layer 120 may include a silicon nitride and/or a silicon oxide. The buffer layer 120 may prevent penetration of a foreign component such as impurities or moisture, and the buffer layer 120 may also planarize the surface of the substrate 110. The buffer layer 120 may be disposed in both the display area DA and the non-display area NDA. According to some exemplary embodiments of the present inventive concept, the buffer layer 120 may be entirely omitted.

A semiconductor 130 is disposed on the buffer layer 120. The semiconductor 130 may be made of a polycrystalline semiconductor material and/or an oxide semiconductor material. The semiconductor 130 includes a channel region 131 and contact doping regions 132 and 133 disposed at respective sides of the channel region 131. The contact doping regions 132 and 133 may be doped with an impurity. The contact doping regions 132 and 133 may each include a source region 132 and a drain region 133. Here, a kind of the impurity used is changed depending on the kind of the thin film transistor being produced.

The dummy pattern layer 138 disposed in the non-display area NDA may be disposed on the same layer as the semiconductor 130, which is disposed in the display area DA. The dummy pattern layer 138 and the semiconductor 130 may be formed together using the same material.

The first gate insulating layer 141 is disposed on the semiconductor 130. The first gate insulating layer 141 may be made of the inorganic insulating material such as a silicon nitride and/or a silicon oxide. The first gate insulating layer 141 may be disposed in both the display area DA and the non-display area NDA of the substrate 110.

A gate electrode 150 is disposed on the first gate insulating layer 141. For example, the gate electrode 150 overlaps at least part of the semiconductor 130, for example, the gate electrode 150 may overlap at least part of the channel region 131.

The second gate insulating layer 142 is disposed on the gate electrode 150 and the first gate insulating layer 141. The second gate insulating layer 142 may be made of the inorganic insulating material such as a silicon nitride and/or a silicon oxide. The second gate insulating layer 142 may be disposed in both the display area DA and the non-display area NDA of the substrate 110.

The interlayer insulating layer 160 is disposed on the second gate insulating layer 142. The interlayer insulating layer 160 may be made of the inorganic insulating material or the organic insulating material. The interlayer insulating layer 160 may be disposed in both the display area DA and the non-display area NDA of the substrate 110.

The first gate insulating layer 141, the second gate insulating layer 142, and the interlayer insulating layer 160 have contact holes 162 and 164 overlapping at least part of the semiconductor 130. The contact holes 162 and 164 may expose the contact doping regions 132 and 133 of the semiconductor 130.

A source electrode 173 and a drain electrode 175 are disposed on the interlayer insulating layer 160. The source electrode 173 is connected to the source region 132 of the semiconductor 130 through the contact hole 162, and the drain electrode 175 is connected to the drain region 133 of the semiconductor 130 through the contact hole 164.

The connection electrode 178 disposed in the non-display area NDA may be disposed in the same layer as the source electrode 173 and the drain electrode 175 disposed in the display area DA. The data lines D1, D2, D3, D4, D5, D6 . . . , D(m-5), D(m-4), D(m-3), D(m-2), D(m-1), and Dm may be disposed in the same layer as the source electrode 173 and the drain electrode 175. For example, the connection electrode 178 may be disposed in the same layer as the data lines D1, D2, D3, D4, D5, D6 . . . , D(m-5), D(m-4), D(m-3), D(m-2), D(m-1), and Dm. The connection electrode 178, the source electrode 173, the drain electrode 175, and the data lines D1, D2, D3, D4, D5, D6 . . . , D(m-5), D(m-4), D(m-3), D(m-2), D(m-1), and Dm may be formed together using the same material.

As described above, the semiconductor 130, the gate electrode 150, the source electrode 173, and the drain electrode 175 form one thin film transistor. A configuration of the thin film transistor is not limited to the above-described example, and can be changed in various ways.

A passivation layer 180 is disposed on the thin film transistor and the interlayer insulating layer 160. The passivation layer 180 may be used to increase emission efficiency of an organic light emitting diode (OLED) to be formed thereon. The passivation layer 180 may also serve to provide planarization. The passivation layer 180 has a contact hole 182 overlapping at least part of the drain electrode 175.

The passivation layer 180 may be made of an acrylic resin, an epoxy resin, a phenolic resin, a polyamide resin, a polyimide resin, an unsaturated polyesters resin, a polyphenylene resin, a polyphenylene sulfide resin, and/or benzocyclobutene (BCB).

A first electrode 191 is disposed on the passivation layer 180. The first electrode 191 may be made of a transparent conductive material such as indium-tin oxide (ITO), indium-zinc oxide (IZO), zinc oxide (ZnO), and/or indium oxide ($In_2O_3$), and/or a reflective metal such as lithium (Li), calcium (Ca), lithium fluoride/calcium (LiF/Ca), lithium fluoride/aluminum (LiF/Al), aluminum (Al), silver (Ag), magnesium (Mg), and/or gold (Au). The first electrode 191 is electrically connected to the drain electrode 175 of the thin film transistor through the contact hole 182 formed in the passivation layer 180. The first electrode 191 may be an anode of the organic light emitting diode (OLED).

The first electrode 191 may include a first transparent electrode and a second transparent electrode that are made of a transparent conductive material, and a transflective layer disposed between the first transparent electrode and the second transparent electrode and used to form a microcavity along with a second electrode 270. For example, the first electrode 191 may be made of a multilayer including a layer made of the transparent conductive material and a layer made of a reflective metal.

A pixel definition layer 350 is disposed on the passivation layer 180 and an edge of the first electrode 191. The pixel definition layer 350 has a pixel opening 351 that does not cover the first electrode 191. The pixel definition layer 350 encloses the edge of the first electrode 191. The pixel definition layer 350 may include a resin such as a polyacrylic or a polyimide, or a silica-based inorganic material.

An organic emission layer 370 is formed in the pixel opening 351 of the pixel definition layer 350. The organic emission layer 370 is formed in a plurality of layers including an emission layer, a hole-injection layer (HIL), a hole-transporting layer (HTL), an electron-transporting layer (ETL), and/or an electron-injection layer (EIL). When the organic emission layer 370 includes all of the layers, the hole-injection layer is disposed on the first electrode 191 as the anode, and the hole-transporting layer, the emission layer, the electron-transporting layer, and the electron-injection layer may be sequentially stacked thereon.

The organic emission layer 370 may include a red emitting layer emitting red light, a green emitting layer emitting green light, and a blue emitting layer emitting blue light. The red emitting layer, the green emitting layer, and the blue emitting layer are respectively formed on a red pixel, a green pixel, and a blue pixel so that a color image may be displayed by the combination of red, green, and blue light.

Further, the red organic emission layer, the green organic emission layer, and the blue organic emission layer are integrally stacked in the organic emission layer 370 together with the red pixel, the green pixel, and the blue pixel to respectively form a red color filter, a green color filter, and a blue color filter in each pixel so that a color image may be displayed by the combination of red, green, and blue light. Alternatively, a white organic emission layer emitting white light is formed on each of the red pixel, the green pixel, and the blue pixel, and a red color filter, a green color filter, and a blue color filter are respectively formed for each pixel so that a color image may be displayed by the combination of red, green, and blue light. When the color image is implemented by using the white organic emission layer and the color filter, a deposition mask for depositing the red organic emission layer, the green organic emission layer, and the blue organic emission layer on individual pixels, for example, the red pixel, the green pixel, and the blue pixel, is not required.

The white organic emission layer described herein may be formed to have a single organic emission layer, and may further include a configuration in which a plurality of organic emission layers are stacked to emit white light. For example, a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light may be further included.

The second electrode 270 is disposed on the pixel definition layer 350 and the organic emission layer 370. The second electrode 270 is connected to the common voltage line ELVSS, thereby receiving a common voltage. The second electrode 270 may be made of the transparent conductive material such as indium-tin oxide (ITO), indium-zinc oxide (IZO), zinc oxide (ZnO), and/or indium oxide ($In_2O_3$), and/or the reflective metal such as lithium (Li), calcium (Ca), lithium fluoride/calcium (LiF/Ca), lithium fluoride/aluminum (LiF/Al), aluminum (Al), silver (Ag), magnesium (Mg), and/or gold (Au). The second electrode 270 may be a cathode of the organic light emitting diode (OLED). The first electrode 191, the organic emission layer 370, and the second electrode 270 may form the organic light emitting diode (OLED).

The display device, according to an exemplary embodiment of the present inventive concept, may further include a first capacitor electrode 159a, disposed between the first gate insulating layer 141 and the second gate insulating layer 142, and a second capacitor electrode 159b, disposed on the second gate insulating layer 142.

The first capacitor electrode 159a and the second capacitor electrode 159b may overlap each other. The second gate insulating layer 142 is disposed between the first capacitor electrode 159a and the second capacitor electrode 159b. For example, two electrodes 159a and 159b may overlap each other via the second gate insulating layer 142, which is made of the insulating material, thereby forming the capacitor. For example, the second gate insulating layer 142 may function as a dielectric material.

The first crack sensing line CD1 disposed in the non-display area NDA may be disposed in the same layer as the second capacitor electrode 159b, which is disposed in the display area DA. The first crack sensing line CD1 and the second capacitor electrode 159b may be formed together using the same material.

Next, an operation of the display device, according to an exemplary embodiment of the present inventive concept, will be described with reference to FIG. 6.

Figure 6:
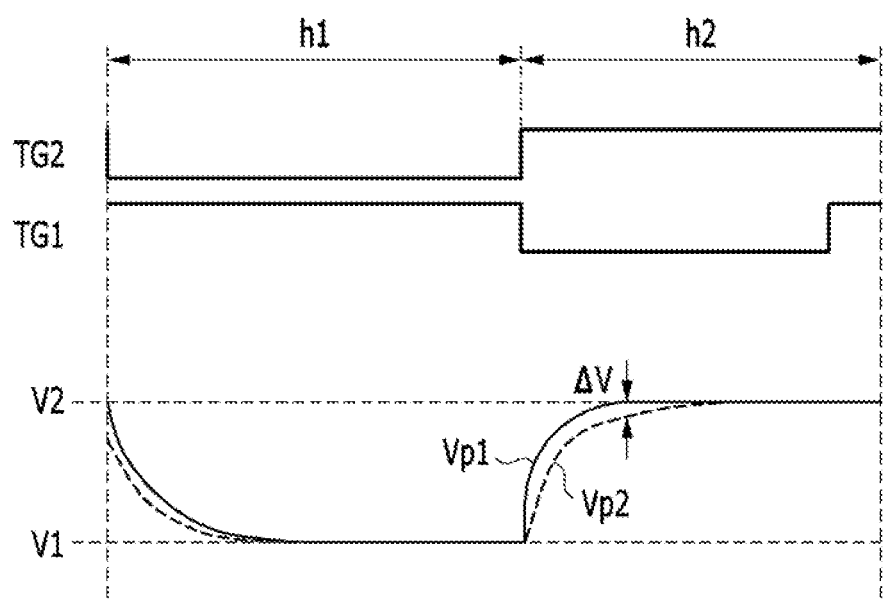
FIG. 6 is a waveform diagram illustrating signals applied to a display device according to an exemplary embodiment of the present inventive concept.

FIG. 6 is a waveform diagram of signals applied to a display device according to an exemplary embodiment of the present inventive concept.

As shown in FIG. 6, if the gate-on signal is applied to the first test gate line TG1 during a first time h1, then the first switching element Q1 enters a turned-on state. The first voltage V1 applied to the first test signal line TD1 is transmitted to each of the plurality of data lines D1, D2, D3, D4, D5, D6 . . . , D(m-5), D(m-4), D(m-3), D(m-2), D(m-1), and Dm that are connected to the first switching element Q1 through the first switching element Q1. The first voltage V1 may be a voltage to display a highest gray level by the plurality of pixels R, G, and B. If the first voltage V1 is applied to the plurality of data lines D1, D2, D3, D4, D5, D6 . . . , D(m-5), D(m-4), D(m-3), D(m-2), D(m-1), and Dm, then the voltage Vp1 of the plurality of pixels R, G, and B becomes the first voltage V1, thereby displaying white.

After a gate-off signal is applied to the first test gate line TG1, if the gate-on signal is applied to the second test gate line TG2 during the second time h2, then the second switching element Q2 enters the turned-on state. The second voltage V2 applied to the second test signal lines TD2a, TD2b, and TD2c, is transmitted to the plurality of data lines D1, D2, D3, D4, D5, D6 . . . , D(m-5), D(m-4), D(m-3), D(m-2), D(m-1), and Dm. The second voltage V2 may be a voltage to display a lowest gray level by the plurality of pixels R, G, and B. If the second voltage V2 is applied to each of the plurality of data lines D1, D2, D3, D4, D5, D6 . . . , D(m-5), D(m-4), D(m-3), D(m-2), D(m-1), and Dm, then the voltage Vp1 of the plurality of pixels R, G, and B becomes the second voltage V2, thereby displaying black.

If a crack forms in the non-display area NDA of the substrate 110, the first crack sensing line CD1 or the second crack sensing line CD2 may be damaged.

The first crack sensing line CD1 is connected to the first data line D2. If the crack forms in the non-display area NDA of the substrate 110, the first crack sensing line CD1 may be damaged, and the resistance of the first data line D2 increases. Accordingly, the voltage Vp2 of the pixel (G) connected to the first data line D2 reaches the second voltage V2, thereby causing a voltage difference (ΔV) of the second voltage V2. The pixel (G) connected to the first data line D2 does not display the lowest gray level by the voltage difference (ΔV), but displays a higher gray level than the lowest gray level. Accordingly, if the crack forms in the non-display area NDA of the substrate 110, a bright line may be recognized along the first data line D2. For example, through the recognition of the bright line along the first data line D2, the crack of the non-display area NDA of the substrate 110 may be detected.

The second crack sensing line CD2 is connected to the second data line D(m-1). If the crack forms in the non-display area NDA of the substrate 110, the second crack sensing line CD2 may be damaged, and thereby the resistance of the second data line D(m-1) increases. Accordingly, the voltage Vp2 of the pixel (G) connected to the second data line D(m-1) does not reach the second voltage V2, and the voltage difference (ΔV) of the second voltage V2 is generated. The pixel (G) connected to the second data line D(m-1) does not display the lowest gray level by the voltage difference (ΔV), but displays the higher gray level than the lowest gray level. Accordingly, if the crack forms in the non-display area NDA of the substrate 110, a bright line may be recognized along the second data line D(m-1). For example, through the recognition of the bright line along the second data line D(m-1), the crack of the non-display area NDA of the substrate 110 may be detected.

Next, a connection position where the first crack sensing line CD1 and the second crack sensing line CD2 are connected to the dummy pattern layer in the display device, according to an exemplary embodiment of the present inventive concept, will be described with reference to FIG. 7 to FIG. 9.

Figure 7:
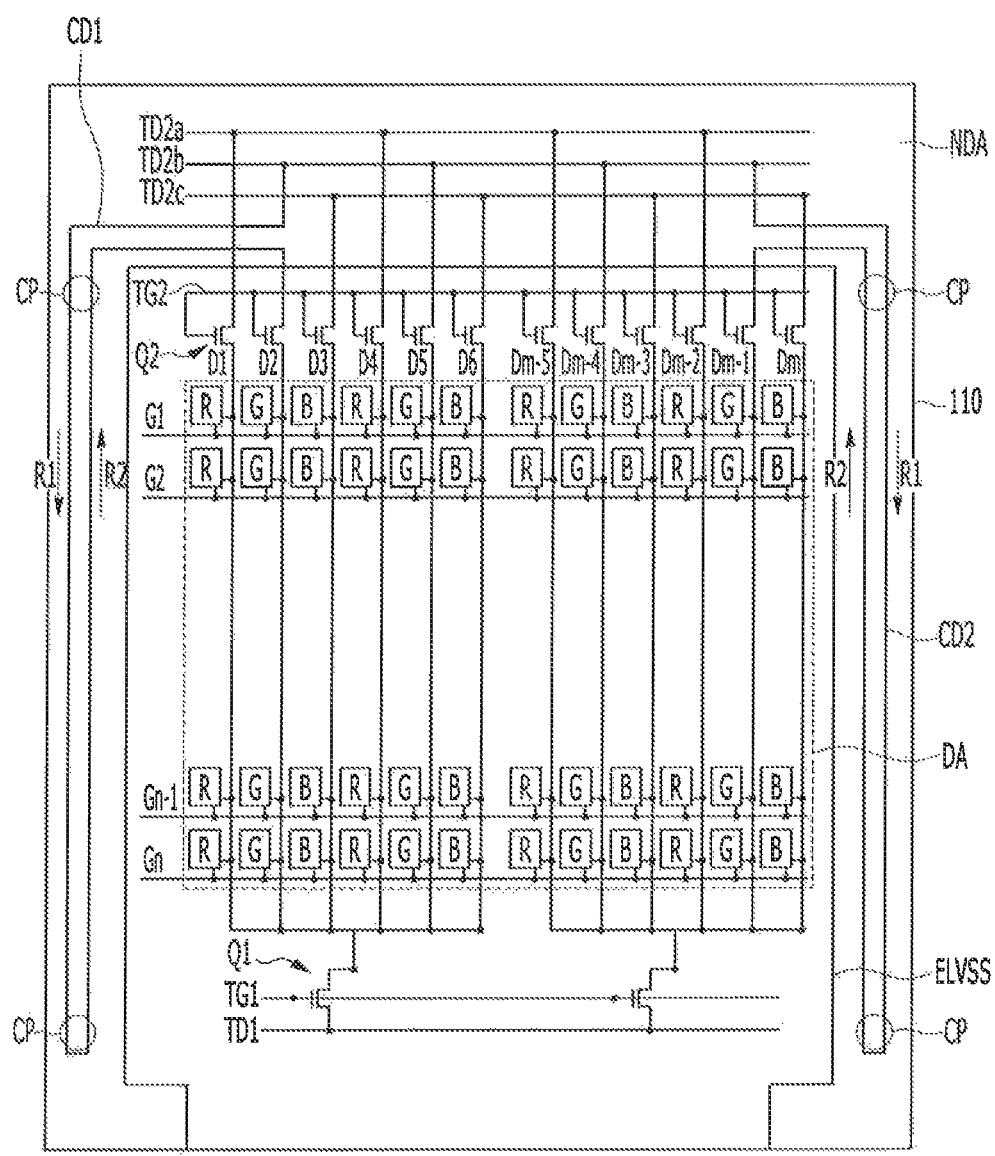
FIG. 7 to FIG. 9 are top plan views illustrating a display device according to an exemplary embodiment of the present inventive concept.
Figure 8:
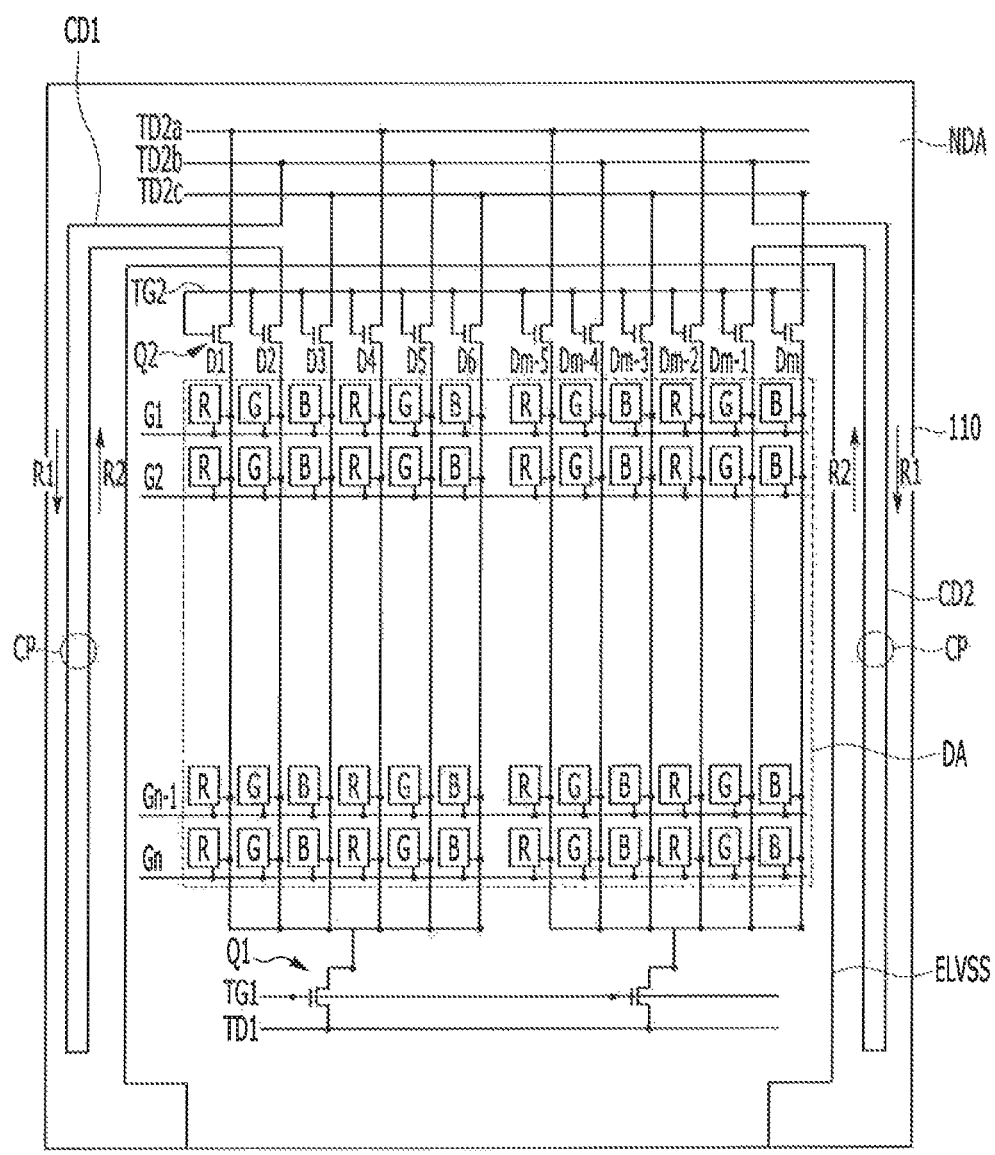
Figure 9:
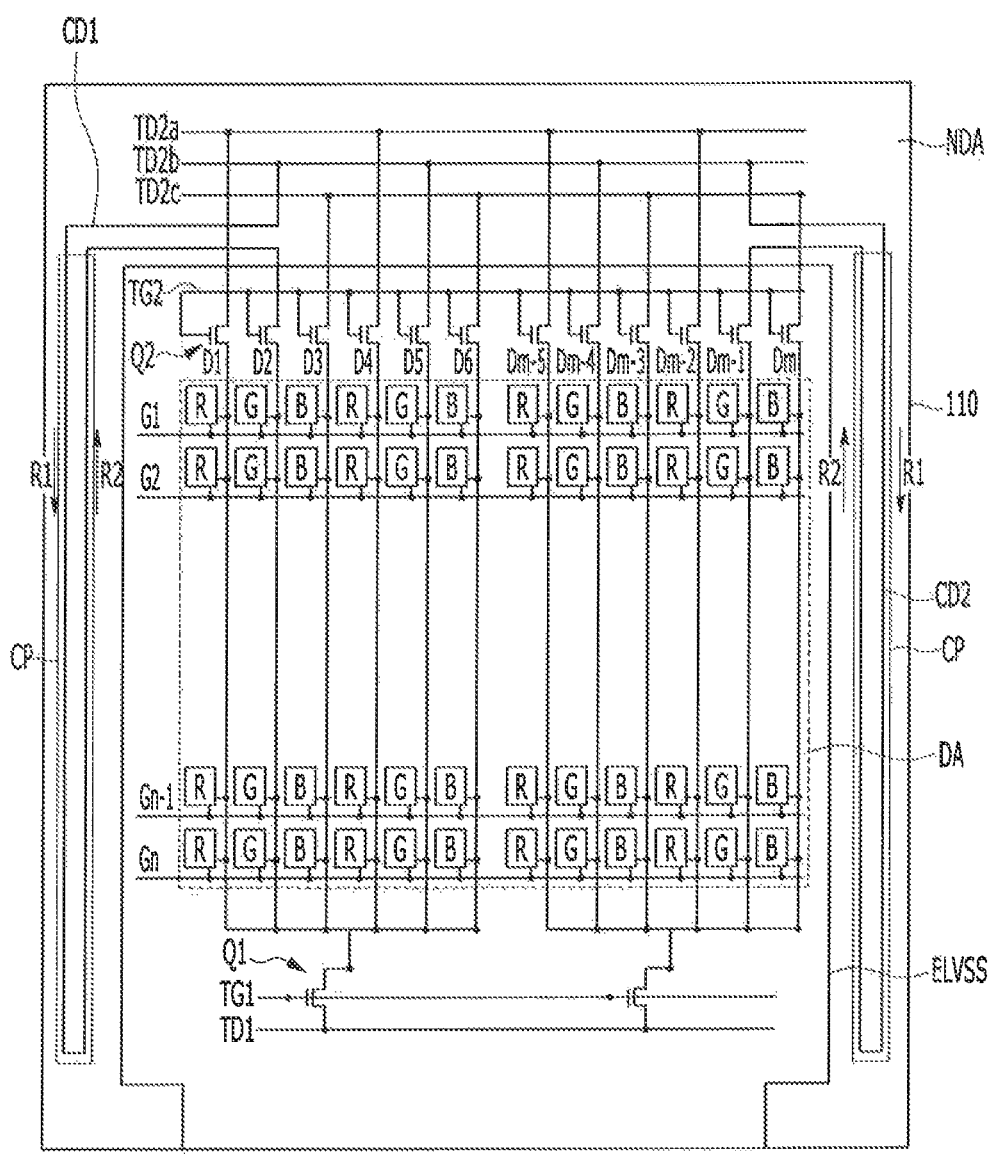

FIG. 7 to FIG. 9 are top plan views illustrating a display device according to an exemplary embodiment of the present inventive concept.

As shown in FIG. 7, the connection position CP where the first crack sensing line CD1 and the second crack sensing line CD2 are connected to the dummy pattern layer may be disposed at a left upper end, a left lower end, a right upper end, and a right lower end of the display device. As previously described, a part extending in the second direction R2 of the first crack sensing line CD1 and the second crack sensing line CD2 may be connected to the dummy pattern layer. However alternatively, a part extending in the first direction R1 of the first crack sensing line CD1 and the second crack sensing line CD2 may be connected to the dummy pattern layer.

As shown in FIG. 8, the connection position CP where the first crack sensing line CD1 and the second crack sensing line CD2 are connected to the dummy pattern layer may be disposed at a left center or a right center of the display device.

As shown in FIG. 9, the connection position CP where the first crack sensing line CD1 and the second crack sensing line CD2 are connected to the dummy pattern layer may be continuously disposed along a left edge and a right edge of the display device. A position and a number of connection positions CP, and a distance between adjacent connection positions CP, may be variously changed.

Next, the display device, according to an exemplary embodiment of the present inventive concept, will be described with reference to FIG. 10.

Figure 10:
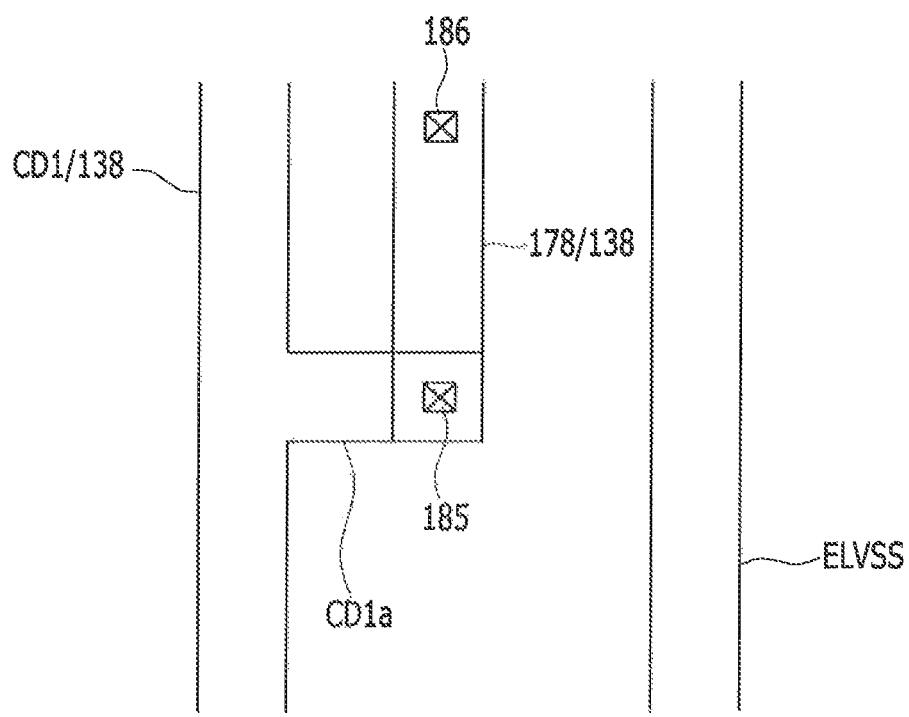
FIG. 10 is a top plan view illustrating a non-display area of a display device according to an exemplary embodiment of the present inventive concept.

The display device, according to an exemplary embodiment of the present inventive concept, shown in FIG. 10 may be substantially similar to the display device shown in FIG. 1 to FIG. 9. Thus, to the extent that a detailed description of various elements is omitted, it may be assumed that these elements are similar to or the same as the corresponding elements of FIG. 1 to FIG. 9. However, the approach of FIG. 10 is different from the previously-described approach in that the first crack sensing line protrudes at a particular point.

FIG. 10 is a top plan view illustrating a non-display area of a display device according to an exemplary embodiment of the present inventive concept.

As shown in FIG. 10, the first crack sensing line CD1 extends in parallel to the common voltage line ELVSS and overlaps the dummy pattern layer 138. The connection electrode 178 is parallel to the first crack sensing line CD1 and overlaps the dummy pattern layer 138.

The first crack sensing line CD1 includes a protrusion CD1a protruded toward the common voltage line ELVSS, and the protrusion CD1a overlaps the connection electrode 178. The protrusion CD1a of the first crack sensing line CD1 is connected to the connection electrode 178 through the first contact hole 185. The dummy pattern layer 138 is connected to the connection electrode 178 through the second contact hole 186. Accordingly, the first crack sensing line CD1 is connected to the dummy pattern layer 138 through the connection electrode 178.

Next, the display device, according to an exemplary embodiment of the present inventive concept, will be described with reference to FIG. 11.

Figure 11:
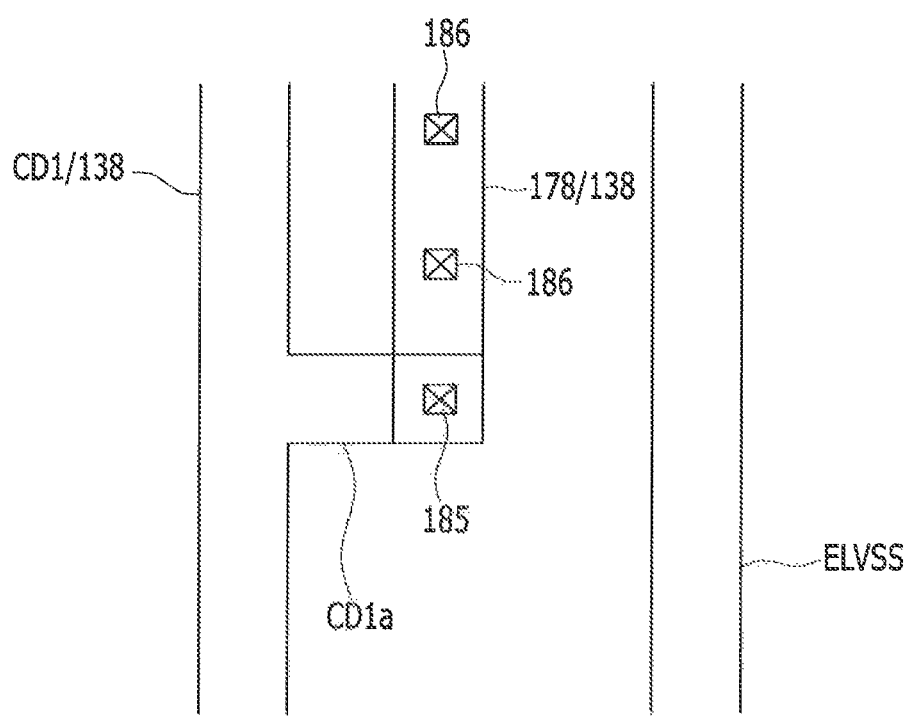
FIG. 11 is a top plan view illustrating a non-display area of a display device according to an exemplary embodiment of the present inventive concept.

The display device, according to an exemplary embodiment of the present inventive concept, shown in FIG. 11 may be similar to the display device shown in FIG. 1 to FIG. 9. Any omitted details may be assumed to be the same as corresponding elements of the configuration discussed above. However, in the configuration shown in FIG. 11, the dummy pattern layer and the connection electrode are connected through the plurality of second contact holes.

FIG. 11 is a top plan view showing a non-display area of a display device, according to an exemplary embodiment of the present inventive concept.

As shown in FIG. 11, the protrusion CD1*a* of the first crack sensing line CD1 is connected to the connection electrode 178 through one first contact hole 185. The dummy pattern layer 138 is connected to the connection electrode 178 through two second contact holes 186. A number of the first contact holes 185 to connect the first crack sensing line CD1 and the connection electrode 178 may be variously changed. Likewise, a number of the second contact holes 186 to connect the dummy pattern layer 138 and the connection electrode 178 may be variously changed.

Next, the display device, according to an exemplary embodiment of the present inventive concept, will be described with reference to FIG. 12 and FIG. 13.

Figure 12:
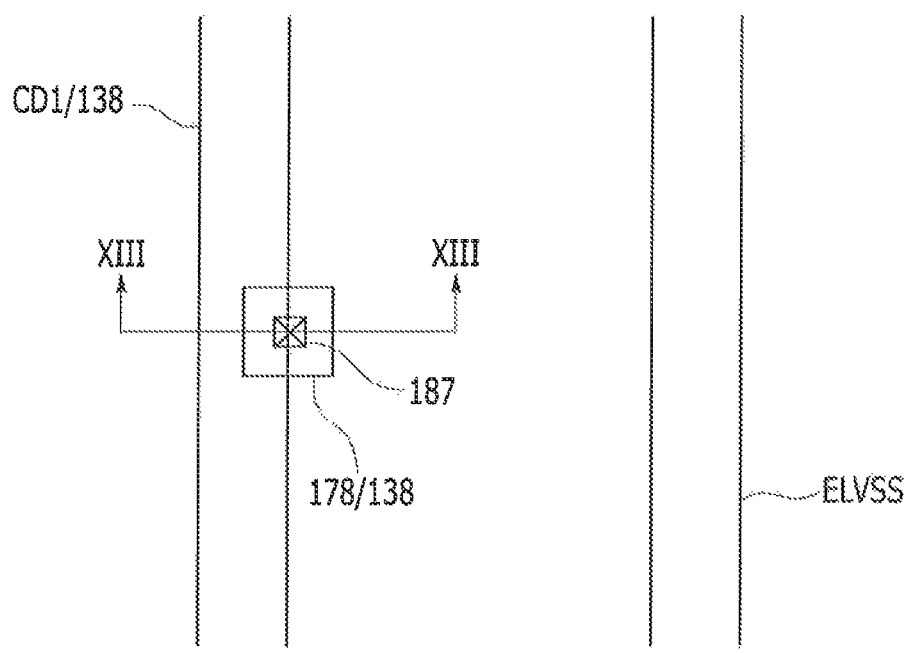
FIG. 12 is a top plan view illustrating a non-display area of a display device according to an exemplary embodiment of the present inventive concept.
Figure 13:
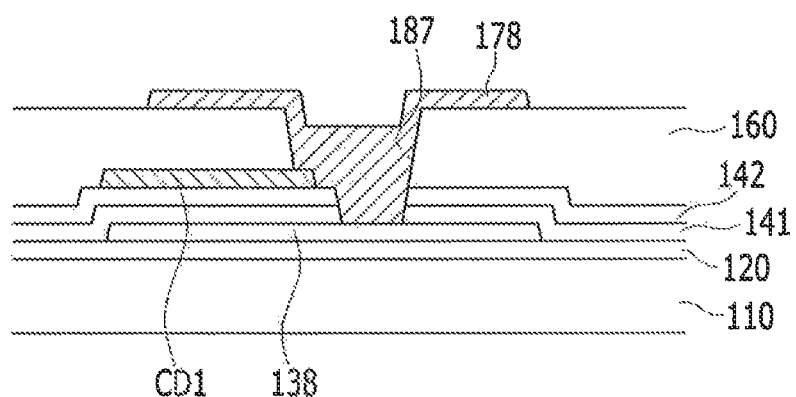
FIG. 13 is a cross-sectional view illustrating a non-display area of FIG. 12 taken along a line XIII-XIII.

The display device, according to an exemplary embodiment of the present inventive concept, and shown in FIG. 12 and FIG. 13 may be substantially similar to the display device shown in FIG. 1 to FIG. 9. It may therefore be assumed that any omitted details are the same as corresponding elements described above. However, the configuration of FIG. 12 and FIG. 13 are different in that the connection electrode is connected to the dummy pattern layer and the first crack sensing line through one contact hole.

FIG. 12 is a top plan view showing a non-display area of a display device, according to an exemplary embodiment of the present inventive concept, and FIG. 13 is a cross-sectional view of a non-display area of FIG. 12 taken along a line XIII-XIII.

As shown in FIG. 12 and FIG. 13, the dummy pattern layer 138 is disposed on the substrate 110, and the first gate insulating layer 141 and the second gate insulating layer 142 are deposited on the dummy pattern layer 138. The first crack sensing line CD1 is disposed on the second gate insulating layer 142, and the interlayer insulating layer 160 is disposed on the first crack sensing line CD1. The first gate insulating layer 141, the second gate insulating layer 142, and the interlayer insulating layer 160 have a third contact hole 187 that overlaps the first crack sensing line CD1 and the dummy pattern layer 138. The edge upper surface and the side surface of the first crack sensing line CD1 are exposed by the third contact hole 187, and the upper surface of the dummy pattern layer 138 is exposed.

The connection electrode 178 is disposed on the interlayer insulating layer 160. The connection electrode 178 is connected to the first crack sensing line CD1 and the dummy pattern layer 138 though the third contact hole 187. In this case, the connection electrode 178 is in contact with the upper surface and the side surface of the first crack sensing line CD1 in the third contact hole 187 and is in contact with the upper surface of the dummy pattern layer 138. The first crack sensing line CD1 is connected to the dummy pattern layer 138 through the connection electrode 178.

Next, the display device, according to an exemplary embodiment of the present inventive concept, will be described with reference to FIG. 14 and FIG. 15.

Figure 14:
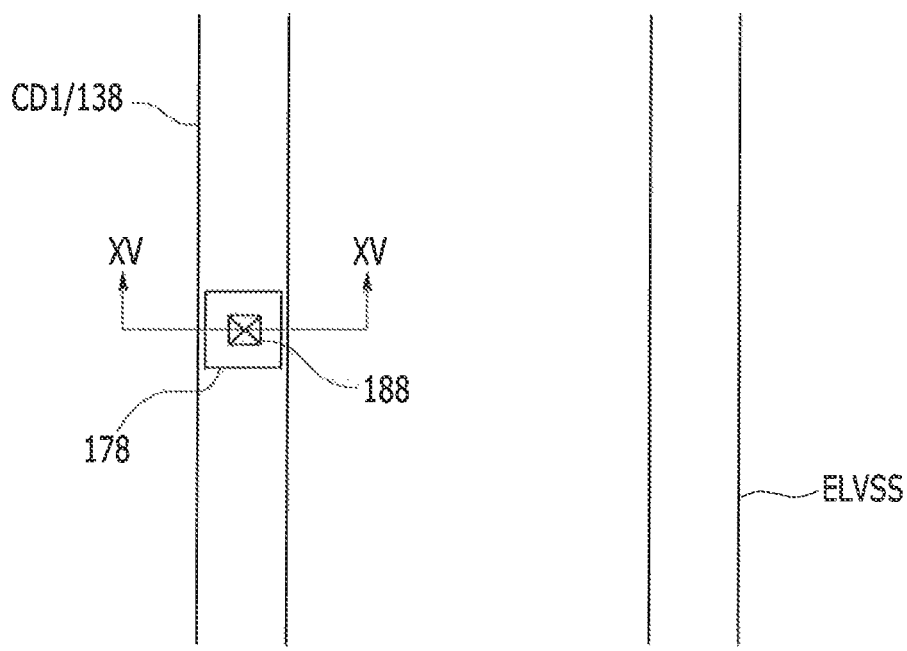
FIG. 14 is a top plan view illustrating a non-display area of a display device according to an exemplary embodiment of the present inventive concept.
Figure 15:
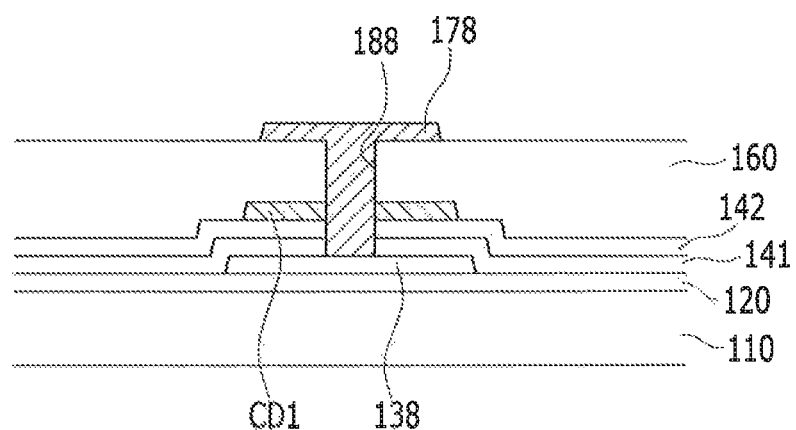
FIG. 15 is a cross-sectional view illustrating a non-display area of FIG. 14 taken along a line XV-XV.

The display device, according to the exemplary embodiment of the present inventive concept, and shown in FIG. 14 and FIG. 15 may be substantially similar to the display device shown in FIG. 1 to FIG. 9. It may be assumed that any omitted description is substantially the same as that of corresponding elements previously described. However, in the approach of FIG. 14 and FIG. 15, the connection electrode is connected to the dummy pattern layer and the first crack sensing line through one contact hole.

FIG. 14 is a top plan view illustrating a non-display area of a display device according to an exemplary embodiment of the present inventive concept, and FIG. 15 is a cross-sectional view illustrating a non-display area of FIG. 14 taken along a line XV-XV.

As shown in FIG. 14 and FIG. 15, the dummy pattern layer 138 is disposed on the substrate 110, and the first gate insulating layer 141 and the second gate insulating layer 142 are deposited on dummy pattern layer 138. The first crack sensing line CD1 is disposed on the second gate insulating layer 142, and the interlayer insulating layer 160 is disposed on the first crack sensing line CD1. A fourth contact hole 188 penetrating the first gate insulating layer 141, the second gate insulating layer 142, the first crack sensing line CD1, and the interlayer insulating layer 160 are formed in the part overlapping the dummy pattern layer 138. The side surface of the first crack sensing line CD1 and the upper surface of the dummy pattern layer 138 are exposed by the fourth contact hole 188.

The connection electrode 178 is disposed on the interlayer insulating layer 160. The connection electrode 178 is connected to the first crack sensing line CD1 and the dummy pattern layer 138 through the fourth contact hole 188. In this case, the connection electrode 178 is in contact with the side surface of the first crack sensing line CD1 and the upper surface of the dummy pattern layer 138 in the fourth contact hole 188. The first crack sensing line CD1 is connected to the dummy pattern layer 138 through the connection electrode 178.

Next, the display device, according to an exemplary embodiment of the present inventive concept, will be described with reference to FIG. 16 and FIG. 17.

Figure 16:
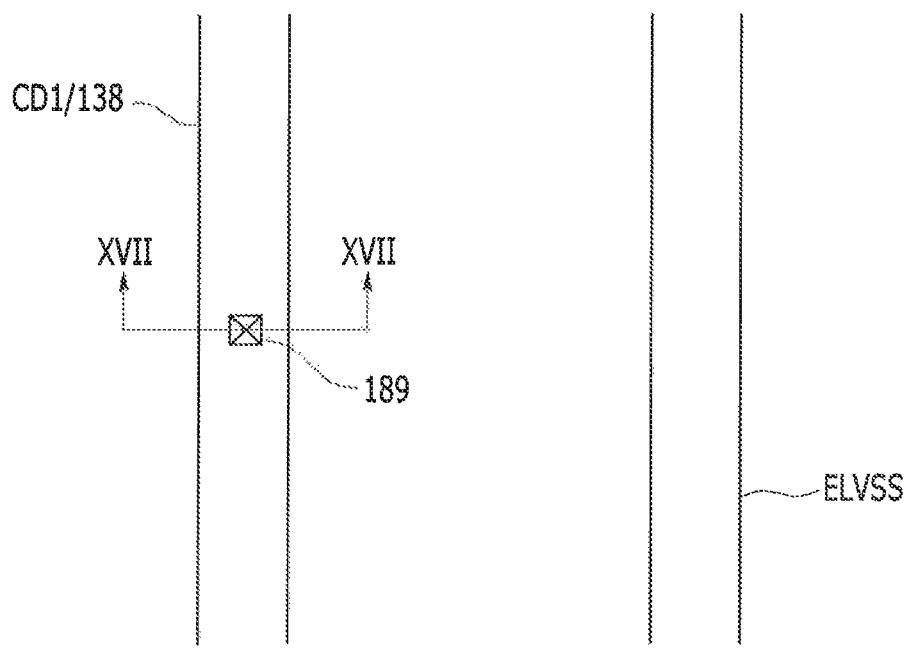
FIG. 16 is a top plan view illustrating a non-display area of a display device according to an exemplary embodiment of the present inventive concept.
Figure 17:
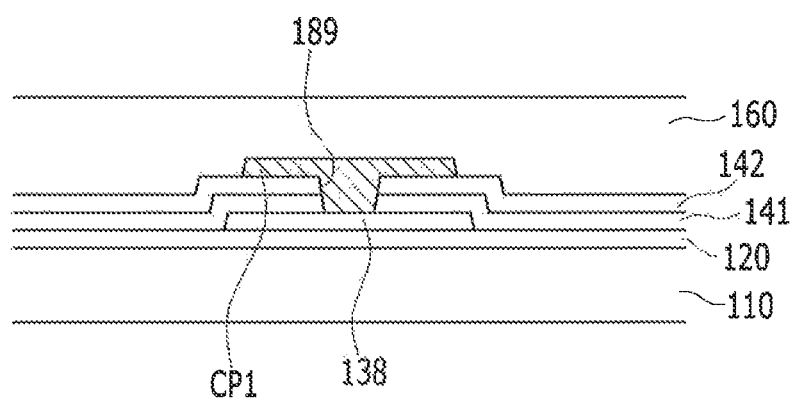
FIG. 17 is a cross-sectional view illustrating a non-display area of FIG. 16 taken along a line XVII-XVII.

The display device, according to the exemplary embodiment of the present inventive concept, and shown in FIG. 16 and FIG. 17 may be substantially the same as the display device shown in FIG. 1 to FIG. 9. To the extent that details are omitted, it may be assumed that these omitted details are substantially the same as the corresponding elements described above. According to the configuration of FIG. 16 and FIG. 17, the connection electrode is not formed.

FIG. 16 is a top plan view illustrating a non-display area of a display device according to an exemplary embodiment of the present inventive concept, and FIG. 17 is a cross-sectional view illustrating a non-display area of FIG. 16 taken along a line XVII-XVII.

As shown in FIG. 16 and FIG. 17, the dummy pattern layer 138 is disposed on the substrate 110, and the first gate insulating layer 141 and the second gate insulating layer 142 are deposited on the dummy pattern layer 138. The first gate insulating layer 141 and the second gate insulating layer 142 have a fifth contact hole 189 overlapping the dummy pattern layer 138. The dummy pattern layer 138 is exposed by the fifth contact hole 189.

The first crack sensing line CD1 is disposed on the second gate insulating layer 142. The first crack sensing line CD1 is directly connected to the dummy pattern layer 138 through the fifth contact hole 189.

Next, the display device, according to an exemplary embodiment of the present inventive concept, will be described with reference to FIG. 18.

Figure 18:
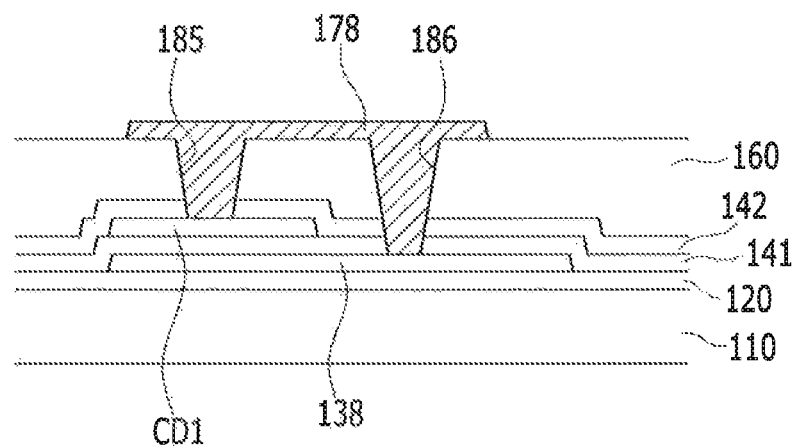
FIG. 18 is a cross-sectional view illustrating a non-display area of a display device according to an exemplary embodiment of the present inventive concept.

The display device, according to the exemplary embodiment of the present inventive concept, and shown in FIG. 18 may be substantially the same as the display device shown in FIG. 1 to FIG. 9. It may be assumed that any omitted description may be similar to corresponding elements previously described. According to the approach of FIG. 18, the first crack sensing line is disposed in the same layer as the gate electrode.

FIG. 18 is a cross-sectional view showing a non-display area of a display device according to an exemplary embodiment of the present inventive concept.

As shown in FIG. 18, the dummy pattern layer 138 is disposed on the substrate 110 and the first gate insulating layer 141 is disposed on the dummy pattern layer 138. The first crack sensing line CD1 is disposed on the first gate insulating layer 141, and the second gate insulating layer 142 and the interlayer insulating layer 160 are deposited on the first crack sensing line CD1. The second gate insulating layer 142 and the interlayer insulating layer 160 have the first contact hole 185 overlapping the first crack sensing line CD1. The first gate insulating layer 141, the second gate insulating layer 142, and the interlayer insulating layer 160 have the second contact hole 186 overlapping the dummy pattern layer 138.

The connection electrode 178 is disposed on the interlayer insulating layer 160. The connection electrode 178 is connected to the first crack sensing line CD1 through the first contact hole 185. The connection electrode 178 is connected to the dummy pattern layer 138 through the second contact hole 186. The first crack sensing line CD1 is connected to the dummy pattern layer 138 through the connection electrode 178.

As described above, the first crack sensing line CD1 disposed in the non-display area (NDA of FIG. 1) is disposed in the same layer as the second capacitor electrode (159b of FIG. 5) disposed in the display area (DA of FIG. 1). The first crack sensing line CD1 disposed in the non-display area (NDA of FIG. 1) may be disposed in the same layer as the gate electrode (150 of FIG. 5) disposed in the display area (DA of FIG. 1). The first crack sensing line CD1 may be disposed in the same layer as the gate lines (G1, G2 . . . , G(n-1), Gn of FIG. 1) of the display area (DA of FIG. 1), and the first capacitor electrode (159a of FIG. 5). The first crack sensing area CD1, the gate electrode (150 of FIG. 5), the gate line (G1, G2 . . . , G(n-1), Gn of FIG. 1), and the first capacitor electrode (159a of FIG. 5) may be formed together using the same material.

While this disclosure has been described in connection with exemplary embodiments of the present inventive concept, it is to be understood that the invention is not limited to the disclosed embodiments, but, on the contrary, is intended to cover various modifications and equivalent arrangements.

What is claimed is:

1. A display device comprising:
a substrate including a display area aid a non-display area;
a plurality of pixels disposed in the display area of the substrate;
a plurality of data lines connected to the plurality of pixels;
a crack sensing line connected to at least one of the plurality of data lines, the crack sensing line disposed in the non-display area of the substrate;
a dummy pattern layer connected to the crack sensing line, the dummy pattern layer having a higher resistance than the crack sensing line; and
wherein the crack sensing line overlaps the dummy pattern layer in a cross-sectional view,
wherein the crack sensing line and the dummy pattern layer cause an RC delay to reduce a peak current in the crack sensing line when static electricity is present in the crack sensing line,
wherein the dummy pattern layer is electrically connected to the crack sensing line by a connection electrode that overlaps an interlayer insulating layer that is disposed over the crack sensing line and the dummy pattern layer,
wherein the interlayer insulating layer is diposed between the crack sensing line and the connection electrode,
wherein the interlayer insulating layer is disposed beteen the dummy pattern layer and the connection electrode, and
wherein the connection electrode is made of the same material as the plurality of data lines.

2. The display device of claim 1, further comprising a common voltage line disposed in the non-display area of the substrate, adjacent to both the crack sensing line and the dummy pattern layer.

3. The display device of claim 2, wherein the crack sensing line and the dummy pattern layer each extend in parallel with the common voltage line.

4. The display device of claim 1, wherein the connection electrode at least partially overlaps each of the crack sensing line and the dummy pattern layer, and
the dummy pattern layer includes a semiconductor material.

5. The display device of claim 1, further comprising:
a semiconductor disposed in the display area of the substrate;
a gate electrode overlapping the semiconductor; and
a source electrode and a drain electrode, each connected to the semiconductor and separated from each other.

6. The display device of claim 5, wherein the crack sensing line is made of the same material as the gate electrode, and the dummy pattern layer is made of the same material as the semiconductor.

7. The display device of claim 5, further comprising:
a first capacitor electrode and a second capacitor electrode each disposed in the display area of the substrate and at least partially overlapping each other,
wherein the crack sensing line is made of the same material as the first capacitor electrode,
wherein the gate electrode is made of the same material as the second capacitor electrode, and
wherein the dummy pattern layer is made of the same material as the semiconductor.

8. The display device of claim 1, further comprising:
a first test gate line and a first test signal line each disposed in the non-display area of the substrate; and
a first switching element connected to the first test gate line, the first test signal line, and the plurality of data lines.

9. The display device of claim 8, further comprising:
a second test gate line and a second test signal line each disposed in the non-display area of the substrate; and a second switching element connected to the second test gate line, the second test signal line, and the at least one of the plurality of data lines.

10. The display device of claim 9, wherein the plurality of data lines receive a first voltage from the first test signal line when a gate-on voltage is applied to the first test gate line, and the plurality of data lines receive a second voltage, that is different from the first voltage, from the second test signal line when the gate-on voltage is applied to the second test gate line.

11. The display device of claim 10, wherein the gate-on voltage is applied to the first test gate line during a first time, and the gate-on voltage is applied to the second test gate line during a second time, the second time occurring after the first time.

12. The display device of claim 9, wherein the crack sensing line is connected to the at least one of the plurality of data lines through the second switching element.

13. A display device comprising:
a substrate including a display area and a non-display area;
a plurality of pixels disposed in the display area of the substrate;
a plurality of data lines connected to the plurality of pixels;
a crack sensing line connected to at least one of the plurality of data lines, the crack sensing line disposed in the non-display area of the substrate;
a dummy pattern layer connected to the crack sensing line;
a connection electrode at least partially overlapping each of the crack sensing line and the dummy pattern layer;
a gate insulating layer disposed between the dummy pattern layer and the crack sensing line and disposed between the dummy pattern layer and the connection electrode;
an interlayer insulating layer disposed between the crack sensing line and the connection, electrode and disposed between the dummy pattern layer and the connection electrode;
a first contact hole formed in the interlayer insulating layer and at least partially overlapping the crack sensing line; and
a second contact hole formed in the interlayer insulating layer and the gate insulating layer an at least partially overlapping the dummy pattern layer,
wherein the crack sensing line and the dummy pattern layer are connected to each other by the connection electrode, and
wherein the connection electrode is connected to the crack sensing line through the first contact hole and is connected to the dummy pattern layer through the second contact hole.

14. A display device comprising:
a substrate including a display area and a non-display area;
a plurality of pixels disposed in the display area of the substrate;
a plurality of data lines connected to the plurality of pixels;
a crack sensing line connected to at least one of the plurality of data lines, the crack sensing line disposed in the non-display area of the substrate; and
a dummy pattern layer connected to the crack sensing line, the dummy pattern layer having a higher resistance than the crack sensing line, wherein the crack sensing line overlaps the dummy pattern layer in a cross-sectional view and does not directly contact the dummy pattern layer, wherein the crack sensing line and the dummy pattern layer cause an RC delay to reduce a peak current in the crack sensing line when static electricity is present in the crack sensing line;
a connection electrode at least partially overlapping each of the crack sensing line and the dummy pattern layer, and wherein the crack sensing line and the dun pattern layer are connected to each other by the connection electrode;
a gate insulating disposed between the dummy pattern layer and the crack sensing line and disposed between the dummy pattern layer and the connection electrode;
an interlayer insulating layer disposed between the crack sensing line and the connection electrode and disposed between the dummy pattern layer and the connection electrode; and
a third contact hole formed in the interlayer insulating layer and the gate insulating layer an at least partially overlapping the crack sensing line and the dummy pattern layer,
wherein the connection electrode is connected to the crack sensing line and the dummy pattern layer through the third contact hole.

15. The display device of claim 14, wherein the connection electrode is in contact with an upper surface and a side surface of the crack sensing line in the third contact hole.

16. A display device comprising:
a substrate including a display area and a non-display area;
a plurality of pixels disposed in the display area of the substrate;
a plurality of data lines connected to the plurality of pixels;
a crack sensing line connected to at least one of the plurality of data lines, the crack sensing line disposed in the non-display area of the substrate; and
a dummy pattern layer connected to the crack sensing line, the dummy pattern layer having a higher resistance than the crack sensing line, wherein the crack sensing line overlaps the dummy pattern layer in a cross-sectional view and does not directly contact the dummy pattern layer, wherein the crack sensing line and the dummy pattern layer cause an RC delay to reduce a peak current in the crack sensing line when static electricity is present in the crack sensing line;
a connection electrode at least partially overlapping each of the crack sensing line and the dummy pattern layer, and wherein the crack sensing line and the dummy pattern layer are connected to each other by the connection electrode;
a gate insulating layer disposed between the dummy pattern layer and the crack sensing line;
an interlayer insulating layer disposed between the crack sensing line and the connection electrode; and
a fourth contact hole penetrating the gate insulating layer, the crack sensing line, and the interlayer insulating layer within an area overlapping the dummy pattern layer,
wherein the connection electrode is connected to the crack sensing line and the dummy pattern layer through the fourth contact hole.

17. The display device of claim 16, wherein the connection electrode is in contact with a side surface of the crack sensing line through the fourth contact hole.

18. A display device comprising:
a flexible substrate;
a plurality of pixels disposed on the flexible substrate;
a plurality of data lines disposed on the substrate and connected to the plurality of pixels;
a first crack sensing line connected to the plurality of data lines; and
a dummy pattern layer disposed between the first crack sensing line and the flexible substrate, the dummy pattern layer having a higher resistance than the first crack sensing line;
an interlayer insulating layer covering the first crack sensing line and the dummy pattern layer; and
a connection electrode over overlapping the interlayer insulating layer, the dummy pattern layer, and the first crack sensing line, and electrically connecting the dummy pattern layer with the first crack sensing line through a pair of corresponding vias that each penetrate the interlayer insulating layer, and
wherein the first crack sensing line overlaps the dummy pattern layer in a cross-sectional view,
wherein the first crack sensing line and the dummy pattern layer cause an RC delay to reduce a peak current in the first crack sensing line when static electricity is present in the first crack sensing line,
wherein the interlayer insulating layer is disposed between the first crack sensing line and the connection electrode,
wherein the interlayer insulating layer is disposed between the dummy pattern layer and the connection electrode, and
wherein the connection electrode is made of the same material as the plurality of data lines.

19. The display device of claim 18, wherein the first crack sensing line causes an artifact to be displayed in the display device when a crack in the substrate is detected by the first crack sensing line.

20. The display device of claim 18, additionally comprising a second crack sensing line connected to the plurality of data lines.

* * * * *